United States Patent
Gao et al.

(10) Patent No.: US 9,713,284 B2
(45) Date of Patent: Jul. 18, 2017

(54) LOCALLY ENHANCED DIRECT LIQUID COOLING SYSTEM FOR HIGH POWER APPLICATIONS

(71) Applicant: Hong Kong Applied Science and Technology Research Institute Co. Ltd., Shatin, New Territories (HK)

(72) Inventors: Ziyang Gao, Hong Kong (HK); Ya Lv, Hong Kong (HK); Yat Kit Tsui, Hong Kong (HK)

(73) Assignee: Hong Kong Applied Science and Technology Research Institute Co. Ltd., Hong Kong (CN)

( * ) Notice: Subject to any disclaimer, the term of this patent is extended or adjusted under 35 U.S.C. 154(b) by 47 days.

(21) Appl. No.: 14/799,594

(22) Filed: Jul. 15, 2015

(65) Prior Publication Data

US 2017/0020027 A1    Jan. 19, 2017

(51) Int. Cl.
*H05K 7/20* (2006.01)
*F28F 3/02* (2006.01)
*H01L 23/473* (2006.01)

(52) U.S. Cl.
CPC ......... *H05K 7/20218* (2013.01); *F28F 3/022* (2013.01); *H05K 7/2039* (2013.01);
(Continued)

(58) Field of Classification Search
CPC ........... H05K 7/20218; H05K 7/20254; H05K 7/20272; H05K 7/20409; H05K 7/2089;
(Continued)

(56) References Cited

U.S. PATENT DOCUMENTS 5,158,136 A * 10/1992 Azar .................. F28F 1/124
165/185
5,514,906 A * 5/1996 Love ................. H01L 23/473
257/712
(Continued)

FOREIGN PATENT DOCUMENTS

CN    103518259    1/2014
TW    201421622    6/2014

OTHER PUBLICATIONS

Ali Kosar, Yoav Peles (Department of Mechanical, Aerospace and Nuclear Engineering, Rensselaer Polytechnic Institute) Thermal-Hydraulic Performance of MEMS-based Pin Fin Heat Sink Feb. 2006 Journal of Heat Transfer vol. 128 / 121.
(Continued)

*Primary Examiner* — Zachary M Pape
*Assistant Examiner* — Amir Jalali
(74) *Attorney, Agent, or Firm* — Eagle IP Limited; Jacqueline C. Lui

(57) ABSTRACT

The present invention discloses a fluid cooling assembly which facilitates turbulent flow inside the assembly so as to achieve better heat dissipating effect. The cooling assembly comprises an enclosed chamber with an inlet and an outlet for fluid to pass through; together with a heat spreader; a plurality of micropillars and a plurality of heat dissipating fins installed inside the assembly. When fluid flows through the chamber, these elements in combination are adapted to create an enhanced turbulent flow upon the fluid so as to effectively dissipate heat from said heat spreader through the fluid.

20 Claims, 10 Drawing Sheets

(52) U.S. Cl.
CPC ..... *H05K 7/20409* (2013.01); *H05K 7/20509* (2013.01); *H01L 23/473* (2013.01); *H05K 7/20254* (2013.01); *H05K 7/20927* (2013.01)

(58) Field of Classification Search
CPC ..... H05K 7/20927; H01L 23/42; H01L 23/44; H01L 23/46; H01L 23/473
USPC .............. 361/699, 701–703; 165/80.4–80.5; 257/714, 722; 174/547–548
See application file for complete search history.

(56) References Cited

U.S. PATENT DOCUMENTS

| | | | | |
|---|---|---|---|---|
| 5,583,316 | A * | 12/1996 | Kitahara | H01L 23/427 174/16.3 |
| 5,650,912 | A * | 7/1997 | Katsui | G06F 1/20 165/122 |
| 5,760,333 | A * | 6/1998 | Kitahara | H01L 23/427 165/80.3 |
| 5,829,514 | A * | 11/1998 | Smith | F28F 3/022 165/185 |
| 5,844,313 | A | 12/1998 | Hoffmann | |
| 6,140,571 | A * | 10/2000 | Kitahara | G03F 7/70433 165/185 |
| 6,173,758 | B1 * | 1/2001 | Ward | F28F 3/022 165/185 |
| 6,244,331 | B1 * | 6/2001 | Budelman | F28F 3/022 165/121 |
| 6,351,384 | B1 * | 2/2002 | Daikoku | F28F 3/02 165/80.3 |
| 6,719,040 | B2 * | 4/2004 | Sugito | F28D 15/0266 165/104.21 |
| 6,729,383 | B1 * | 5/2004 | Cannell | F28F 3/022 165/185 |
| 7,365,980 | B2 | 4/2008 | Prasher | |
| 7,461,690 | B2 * | 12/2008 | Bhatti | H01L 23/367 165/185 |
| 7,521,789 | B1 * | 4/2009 | Rinehart | H01L 23/3735 165/80.4 |
| 7,806,168 | B2 | 10/2010 | Upadhya et al. | |
| 8,246,902 | B2 * | 8/2012 | Hou | B22F 1/0011 165/104.26 |
| 8,413,712 | B2 * | 4/2013 | Brunschwiler | H01L 23/4735 165/80.2 |
| 8,537,554 | B1 * | 9/2013 | Hockaday | H01L 23/467 136/246 |
| 8,746,330 | B2 * | 6/2014 | Lyon | F28D 15/00 165/168 |
| 9,074,823 | B2 * | 7/2015 | Chang | F28D 15/0233 |
| 9,111,911 | B2 * | 8/2015 | Niimi | H01L 23/473 |
| 9,414,525 | B2 * | 8/2016 | Campbell | H05K 7/2039 |
| 2003/0132042 | A1 * | 7/2003 | Beihoff | B60L 11/12 180/65.1 |
| 2004/0244947 | A1 * | 12/2004 | Chen | F28F 3/04 165/80.3 |
| 2009/0145581 | A1 * | 6/2009 | Hoffman | F28F 1/40 165/80.3 |
| 2010/0172091 | A1 * | 7/2010 | Nishiura | H01L 23/3735 361/689 |
| 2011/0146953 | A1 * | 6/2011 | Chen | F28D 15/046 165/104.26 |
| 2013/0333746 | A1 * | 12/2013 | Lockenhoff | G06F 1/20 136/246 |
| 2014/0138075 | A1 * | 5/2014 | Yang | H01L 23/3735 165/185 |
| 2014/0153193 | A1 | 6/2014 | Engelhardt et al. | |
| 2015/0008574 | A1 * | 1/2015 | Gohara | H01L 23/473 257/714 |
| 2015/0194363 | A1 * | 7/2015 | Jun | H01L 23/367 257/714 |

OTHER PUBLICATIONS

Girish Upadhya, Mark Munch, Peng Zhou, James Hom, Douglas Werner, Mark McMaster Micro-Scale Liquid Cooling System for High Heat Flux Processor Cooling Applications 22nd IEEE Semi-Therm Symposium.

The Chilldyne Cool-Flo System Liquid Cooling for Data Centers Technical Brief.

* cited by examiner

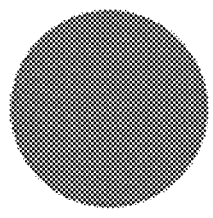
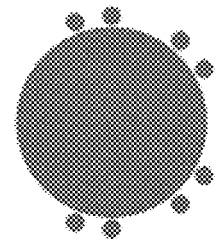
Figure 5A
Figure 5B
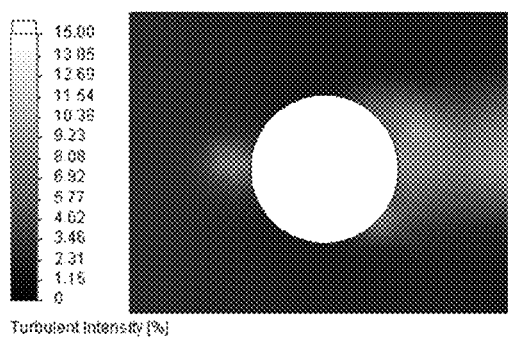
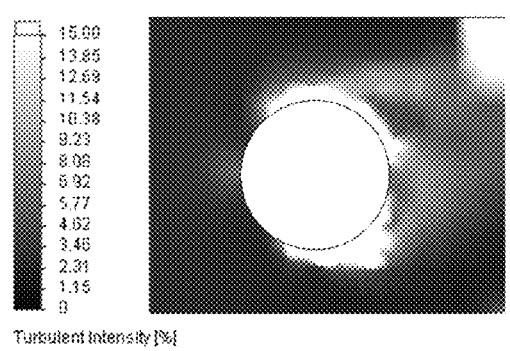
Figure 5C
Figure 5D

A: Heat Spreader; B: Micropillar; C: Pin-fin

| Configuration | Thermal Performance | Coolant Status |
|---|---|---|
| A | 29% | Laminar flow |
| A+B | 36.7% | Laminar flow |
| C | 63.5% | Transitional flow |
| A+C | 100% | Transitional flow |
| A+B+C | 137% | Fully developed turbulent flow |

Figure 7

LOCALLY ENHANCED DIRECT LIQUID COOLING SYSTEM FOR HIGH POWER APPLICATIONS

FIELD OF INVENTION

This invention relates to cooling assembly, and in particular a forced fluid cooling assembly for high power electrical applications.

BACKGROUND OF INVENTION

High power semiconductor chips such as the insulated-gate bipolar transistor (IGBT) generate substantial amount of heat when in use. The typical operating temperature of an IGBT module is up to 200 Celsius, and it is designed to have a long service life of more than 10 years. With the advance in semiconductor fabrication technology, these devices are expected to shrink in size in the future. As such, it becomes an increasing challenging problem to design a compact cooling system that can dissipate the high density heat flux generated by these devices quickly and efficiently. As a result, liquid cooling is widely used in this area.

Conventional liquid cooling solutions employ an enclosed chamber that is attached to the heat generating element(s) so that when the pressurized liquid coolant passes through the chamber, it carries the heat away. The effectiveness of these cooling systems depends on a variety of factors, such as the mass flow rate of the liquid coolant, the efficiency of heat transfer from the heat generating element to the enclosed chamber and then to the liquid coolant. Over the years, many cooling systems have been developed in an attempt to improve the overall heat transfer efficiency by deploying various sub-structures inside the liquid chamber. However, the added complexity in fabricating these sub-structures may easily outweigh its gain in thermal efficiency. Another obvious solution is to employ a higher power pressurized pump to increase the fluid flow speed. But this solution will increase the overall system cost and make the overall cooling system more bulky. Therefore, a better approach is called for to circumvent above-mentioned shortcomings.

SUMMARY OF INVENTION

In the light of the foregoing background, it is an object of the present invention to provide an alternate approach to improve the heat exchange efficiency of a fluid cooling assembly even under nominal pressure fluid flow.

Accordingly, the present invention, in one aspect, is a cooling assembly having a receiving area on a first surface of a first plate that is adapted to receive at least one heat generating element. A heat spreader that has an inner surface and at least one outer surface is disposed inside the cooling assembly. The inner surface of the heat spreader is affixed to a second surface of the first plate adjacently opposite to the receiving area to conductively dissipates heat generated from the at least one heat generating element. A plurality of heat dissipating fins that are spaced apart from each other is also disposed inside the cooling assembly. Each heat dissipating fin is coupled to a second plate and extending transversely therefrom to couple to the heat spreader, wherein the second plate is positioned opposite to the first plate with a space created therebetween to form a channel. A plurality of micropillars is disposed on at least a portion of the at least one outer surface of the heat spreader and the plurality of micropillars is disposed in a predetermined pattern wherein when fluid flows through the channel between the first plate and the second plate, the plurality of heat dissipating fins, the heat spreader and the plurality of micropillars in combination are adapted to create an enhanced turbulent flow upon the fluid so as to effectively dissipate heat from the heat spreader through the fluid.

In an exemplary embodiment of the present invention, the at least one outer surface forms a shape that proximates an isothermal surface. The isothermal surface is formed when heat is dispersed from the at least one heat generating element through the inner surface into the interior of the heat spreader.

In another exemplary embodiment, the heat spreader is a quasi-funnel shape selected from inverted truncated pyramid shape, inverted truncated cone shape, semi-oval shape, hemisphere shape and hemi-ellipsoidal shape In another exemplary embodiment the micropillars are disposed in a predefined pattern around each the heat dissipating fin.

In a further embodiment, the predefined pattern is a grid pattern, and the micropillars are disposed at grid points of the grid pattern except on those locations that are occupied by the heat dissipating fin.

According to another embodiment of the present invention, the predefined pattern is an offset grid pattern comprising alternating first grid lines and second grid lines. The second grid lines are a distance offset from the first grid lines, and the micropillars are disposed at grid points of the offset grid pattern except on those locations that are occupied by the heat dissipating fin.

According to yet another embodiment of the present invention, the plurality of micropillars is disposed around in close proximity but not contacting the heat dissipating fin.

According to a further embodiment of the present invention, the plurality of micropillars is disposed in pairs around each of the heat dissipating fin. Each pair is disposed proximate to each other; and is located at a predetermined angle between a reference line and a central line of the pair. The reference line and the central line of each pair are originated from the center of the corresponding heat dissipating fin, and the reference line is in parallel with the fluid flow.

According to another aspect of the present invention, at least a first pair is located at an angle within a range of 70 degree to 90 degree and at least a second pair is located at an angle within a range of 130 degree to 150 degree. In a further exemplary embodiment, the cooling assembly further includes four side plates to form an enclosed chamber and a device that generates pressurized fluid. The four side plates are the first plate and the second plate; one of the side plate comprising an inlet for fluid to enter into the chamber and another side plate comprises an outlet for fluid to exit the chamber. The device enables the fluid to flow from the inlet to the outlet.

In another exemplary embodiment the micropillars are cylindrical shape with a diameter between 200 μm to 300 μm and a height between 200 μm to 300 μm.

In another exemplary embodiment, the cooling assembly further includes a convex shape object extended from the second plate towards the heat spreader with a space between them.

In another aspect of the present invention, an electronic apparatus is disclosed. The electronic apparatus comprises at least one electronic module wherein the electronic module comprises at least one electronic component that generates heat, and a cooling assembly. The cooling assembly has a receiving area on a first surface of a first plate that is adapted to receive at least one electronic module. A heat spreader that has an inner surface and at least one outer surface is disposed inside the cooling assembly. The inner surface of the heat spreader is affixed to a second surface of the first plate adjacently opposite to the receiving area to conductively dissipate heat generated from the at least one electronic component. A plurality of heat dissipating fins that are spaced apart from each other is also disposed inside the cooling assembly. Each heat dissipating fin is coupled to a second plate and extending transversely therefrom to couple to the heat spreader, wherein the second plate is positioned opposite to the first plate with a space created therebetween to form a channel. A plurality of micropillars is disposed on at least a portion of the at least one outer surface of the heat spreader and the plurality of micropillars is disposed in a predetermined pattern wherein when fluid flows through the channel between the first plate and the second plate, the plurality of heat dissipating fins, the heat spreader and the plurality of micropillars in combination are adapted to create an enhanced turbulent flow upon the fluid so as to effectively dissipate heat from the heat spreader through the fluid.

There are many advantages to the present invention. An advantage is that the shape of heat spreader is designed to proximate to the isothermal line so as to save material of the heat spreader while achieving the same heat dissipating effect. Another advantage is that the channel between the heat spreader and the heat base increases the liquid local flow rate so that the combination of the pin fins and the micropillars on the heat spreader facilitates the formation of enhanced turbulent flow inside the channel so that heat can be exchanged more efficiently to the liquid fluid.

BRIEF DESCRIPTION OF FIGURES

FIG. 5A to 5D show the differences in turbulence intensity between a configuration that adopts heat dissipating fin only and another configuration where the heat dissipating fin is surrounded by micropillars in one exemplary embodiment of present invention.

FIG. 7 shows the thermal performance and coolant status of each combination of heat spreader, micropillars and heat dissipating fin.

DETAILED DESCRIPTION OF THE PREFERRED EMBODIMENTS

As used herein and in the claims, "comprising" means including the following elements but not excluding others.

Figure 1:
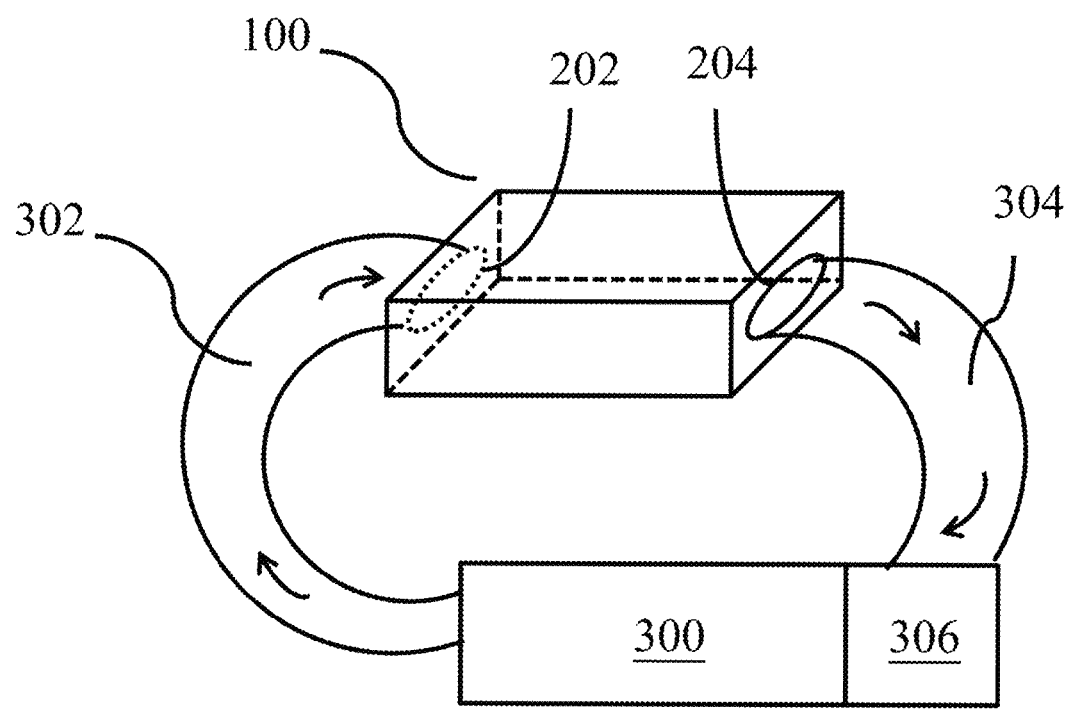
FIG. 1 shows a liquid cooling system in one exemplary embodiment of present invention.
Figure 2:
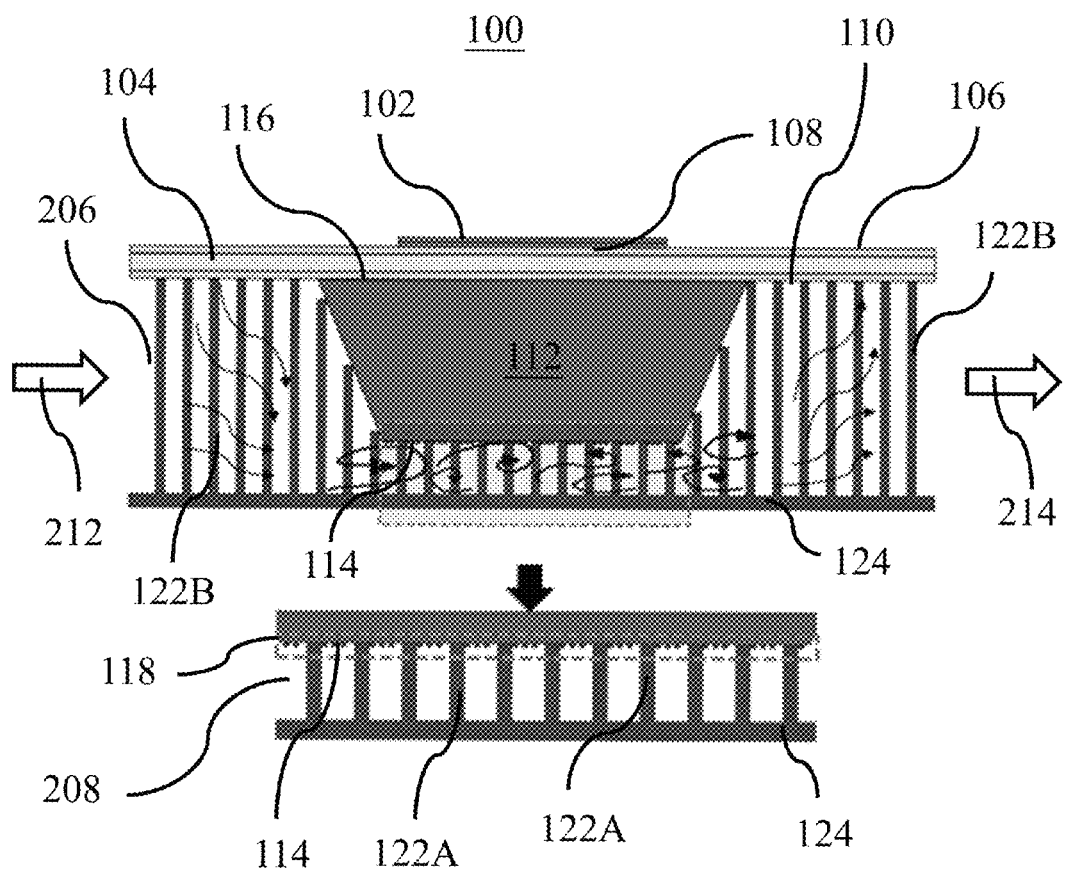
FIG. 2 is a side view of an embodiment of present invention.

Referring to FIG. 1 and FIG. 2, an exemplary implementation of a cooling assembly 100 of this invention is shown. In this embodiment, the cooling assembly 100 is an enclosed chamber having the shape of a rectangular cube with six side plates. The cube includes: a substrate on top, a heat base on bottom, one side plate having an inlet 202, another side plate with an outlet 204 and two other side plates. The substrate is also referred to as the first plate 104 and these two terms are used interchangeably in subsequent paragraphs. Likewise, the heat base is also referred to as the second plate 124 and these two terms are also used interchangeably. A device 300 which generates pressurize liquid is coupled to the inlet 202 via a first pipe 302. The first plate 104, the second plate 124 and the two side plates form a channel 206 for liquid fluid to flow through to the outlet 204. The outlet 204 is coupled to the device 300 via a second pipe 304, creating a return path for the liquid. The cooling module 306 attached to the device 300 is an optional module that cools the fluid flowing from the cooling assembly 100. In one embodiment, the device 300 is a pump.

The cooling assembly 100 further includes a receiving area 108 on the top surface 106 of the first plate 104. At least one heat generating element 102 is affixed onto the receiving area 108. A heat spreader 112 is disposed on the bottom surface 110 of the first plate 104 under the heat generating element 102 to conductively dissipate the heat generated from it. The heat spreader 112 has an inner surface 116 affixing to the bottom surface 110 of the first plate 104; and the area of the inner surface 116 is larger than the receiving area 108 that receives the at least one heat generating element 102 for better thermal conductivity. The heat spreader 112 further has an outer surface 118 facing the second plate 124. A first plurality of heat dissipating fins 122A is extended from the second plate 124 and coupled to the heat spreader 112. A second plurality of heat dissipating fins 122B is extended from the second plate 124 and coupled to the first plate 104. In one embodiment, the first plurality of heat dissipating fins 122A and the second plurality of heat dissipating fins 122B are cylindrical rods of same width but of different height; and are spaced apart from each other. A sub-channel 208 is created between the second plate 124 and the bottom of the heat spreader 112 which is narrower than the channel 206 and thus the flow velocity of the liquid inside the sub-channel 208 is higher than that in the channel 206. A plurality of micropillars 114 is disposed on the outer surface 118 around the plurality of heat dissipating fins 122A.

Now turning to the operation of the cooling assembly 100 described above, heat generated from the at least one heat generating element 102 dissipates through thermal conduction and thermal convection within the cooling assembly 100. The first plate 104, the heat spreader 112, the micropillars 114, the heat dissipating fins 122A and 122B and the second plate 124 are all heat conductive elements. Heat generated from the at least one heat generating element 102 conductively passes through these elements and transfers out of the cooling assembly in two pathways. In one pathway, heat conductively passes through heat conductive elements inside the cooling assembly 100 until it reaches the second plate 124 and the external sides of the cooling assembly 100. Then heat is exchanged with the ambient air surrounding the cooling assembly 100. In another pathway, wherever any of the conductive elements is in contact with the liquid inside the cooling assembly 100, heat is first conductively transferred to the liquid at the boundary between the conductive element and the liquid. Thereafter the convection mode of heat transfer takes effect within the liquid. As the liquid flows from the inlet 202 along the in-direction 212, liquid temperature gradually rises. So hot liquid will flow out of the outlet 204 along the out-direction 214 and will be cooled down by the cooling module 306.

As such, thermal convection occurs within the liquid flow inside channel 206 and sub-channel 208. Fluid flow can basically be classified in three categories—laminar flow, turbulent flow and transitional flow which is a transitional phase between laminar and turbulent flow. Laminar flow occurs when fluid particles moves in relatively orderly manner whereas in turbulent flow, they move violently and chaotically. Depending on the particular flow geometry, a parameter called the Reynolds number delimits laminar and turbulent flow. The turbulent flow accelerates the heat exchange speed in the convection process and hence it is desirable to create a flow geometry that can produce turbulent flow even at nominal flow pressure and mass flow rate generated by the device 300. The flow geometry in this embodiment depends heavily on the relative geometric arrangements between the heat spreader 112, the plurality of heat dissipating fins 112A and 112B, as well as the micropillars 114. The following paragraphs discuss in details the shape and composition of each of these element as well as their relative positions against each other so that enhanced turbulent flow can be created in the sub-channel 208 even the device 300 is an ordinary, low cost liquid pump.

The first plurality of heat dissipating fins 122A and the second plurality of heat dissipating fins 122B are made of the same materials. They are also called pin fins interchangeable. In one embodiment, they are cylindrical rods extended from the second plate 124 upward and in contact with either the heat spreader 112 or the first plate 104 so that heat can be conductively transferred through them. In a further embodiment, they are spaced equally apart from each other to form a regular grid pattern when viewed from the top. As liquid flows onto a flat surface such as the first plate 104, the second plate 124 or the flat surfaces of the heat spreader 112, a boundary layer in the liquid is formed when it is in contact with the surface. The thickness of this boundary layer becomes a barrier for heat exchange between the flat surface plate and the liquid. The pin fins serve to break up the boundary layer so as to facilitate heat transfer and also to facilitate the formation of enhanced turbulent flow of the liquid.

Figure 3:
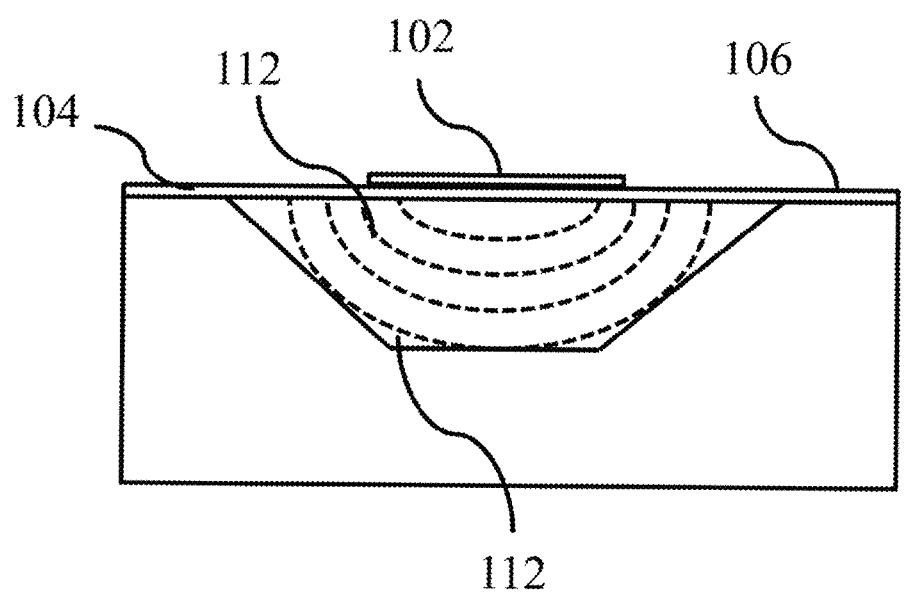
FIG. 3 shows the isothermal lines inside the heat spreader in an embodiment of present invention.

In one embodiment, the heat spreader 112 is a solid object having the shape of an inverted truncated pyramid. The top portion of the inverted truncated pyramid is broader and wider than the bottom portion and is affixed to the first plate 106. FIG. 3 shows the two dimension cross-section view of this inverted truncated pyramid, which is the shape of a trapezoid. As mentioned in previous paragraphs, the top portion of the inverted truncated pyramid forms an inner surface 116. When heat generated by the at least one heat generating element 102 is spread to the heat spreader 112 through the first plate 106, it disperses and diffuses within the heat spreader 112 and forms isothermal surfaces as it progresses. An isothermal surface is typically a curved surface where every point in the surface represents the same temperature. In a two dimension cross-section view, it becomes isothermal lines as shown in FIG. 3. There are advantages to adopt the shape of an inverted truncated pyramid compared to other shapes such as a rectangular cuboid. Firstly, the inverted truncated pyramid approximates the isothermal surface better than a rectangular cuboid. Hence the temperatures at various edge surface points of the inverted truncated pyramid will not vary as much compared to the edge surface points at the rectangular cuboid. Secondly, it takes less mass to make an inverted truncated pyramid than a rectangular cuboid if both objects are to cover the same receiving area. Hence it will be more cost effective to make. Thirdly, the inverted truncated pyramid has a broader total surface area compared to a rectangular cuboid. Hence there is more surface area in contact with the liquid fluid. This will facilitate heat transfer from the heat spreader 112 to the liquid. Moreover, the inverted truncated pyramid, being a quasi-funnel shape, creates a narrow sub-channel 208 inside the channel 206. When liquid fluid is forced to pass through this narrow sub-channel 208, its mass flow rate increases which in turn facilitates the formation of turbulence flow.

As discussed previously, a plurality of micropillars 114 is disposed on the outer surface 118 of the heat spreader 112 around the first plurality of heat dissipating fins 122A. In one embodiment, the micropillars are fabricated using photolithographic technique and hence they share the same material as that of the heat spreader. The shape of each micropillar can be cylindrical, square or rectangular cube depending on the photo masks used in photolithography. The micropillars, being extended from the flat outer surface 118 of the heat spreader 112, serve to disturb the viscous sublayer of the liquid fluid and raise the local convection coefficient to a higher value. This will improve the heat convection within the liquid. The viscous sublayer is caused by viscosity of fluid. At the fluid-solid interface, the fluid viscosity provides a laminar flow inside the viscous sublayer. Furthermore, the geometric arrangement between the plurality of micropillars and the first plurality of the heat dissipating fins 122A, together with the narrowing of the sub-channel 208 further promotes the formation of turbulent flow as liquid flows through these structures.

Figure 4A:
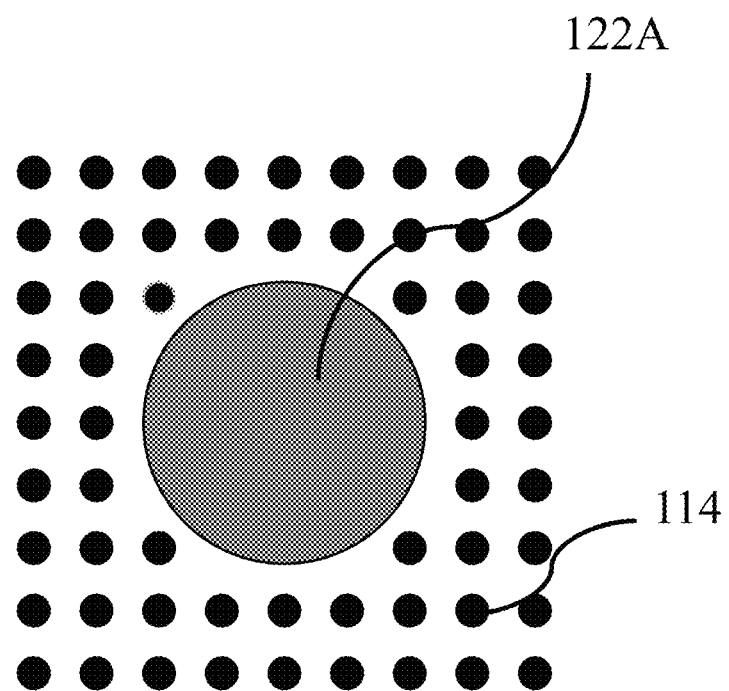
FIGS. 4A, 4B and 4C show three kinds of position relationship between a heat dissipating fin and a plurality of micropillars in three embodiments of the present invention.

In one embodiment, the plurality of micropillars 114 is arranged in a pattern around a heat dissipating fin 122A as shown in FIG. 4A. The pattern is a square grid and the distances between grid points are the same. The micropillars are cylindrical shape and disposed at the grid points of the square grid except for those locations that are occupied by the heat dissipating fins 122A. In a further embodiment, the pattern may be a rectangular grid.

Figure 4B:
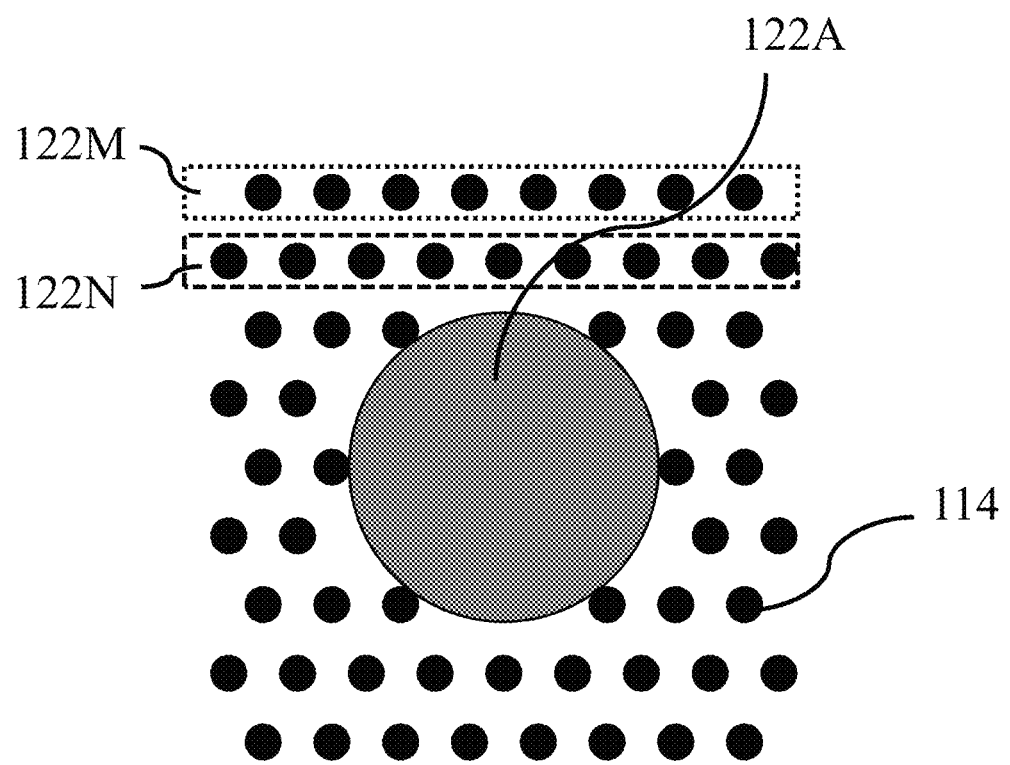

FIG. 4B shows another embodiment of the pattern of a plurality of micropillars 114 around a heat dissipating fin 122A. The pattern is an offset grid pattern having alternating first grid lines 122M and second grid lines 122N. The second grid lines are a fixed distance offset from the first grid lines. Each grid point is surrounded by at most six other grid points with equal distance to that grid point. The micropillars 114 are disposed at the grid points of the offset grid pattern except on those locations that are occupied by the heat dissipating fins 122A.

Figure 4C:
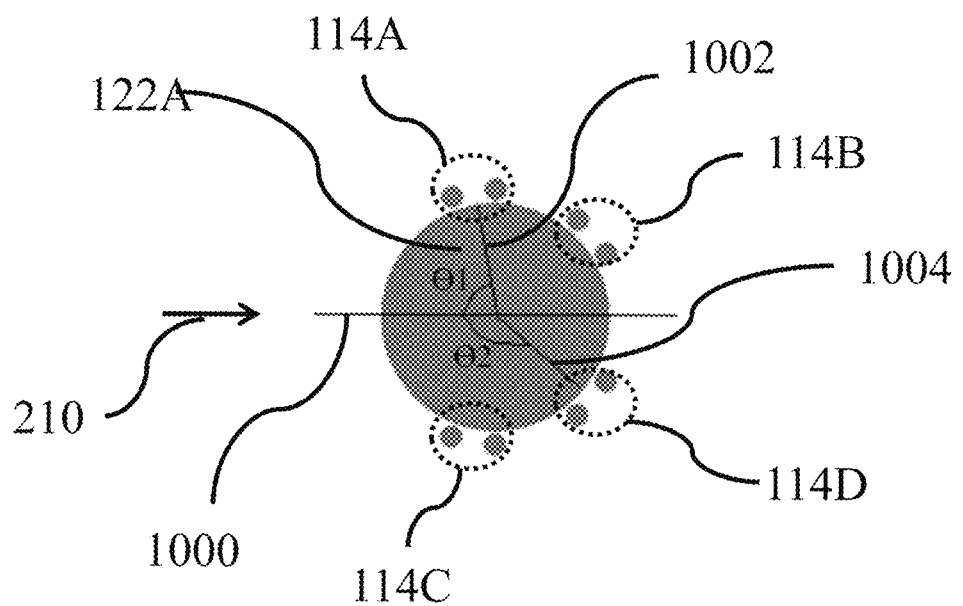

In a further embodiment, the pattern of a plurality of micropillars around a heat dissipating fin 122A is shown in FIG. 4C. In this embodiment, four pairs of micropillars are disposed surrounding but not touching the heat dissipating fin, which in this embodiment is cylindrical shape. A first pair 114A and a second pair 114B are disposed at the first side of a reference line 1000 while a third pair 114C and a fourth pair 114D are disposed at the opposite side of the reference line 1000. The reference line 1000 is parallel to the fluid flow direction 210. Each pair of the micropillars are separated by a small distance and a line can be drawn from the center of the heat dissipating fin cylinder to the mid-point of this small distance that separates this pair. For the micropillar pair 114A, this line is referred to as the first central line 1002 and it forms a first angle $\theta_1$ with the reference line 1000. Likewise, a second central line 1004 can be drawn from the center of the heat dissipating fin cylinder to the mid-point of the small distance that separates the micropillar pair 114D. The second central line 1004 and the reference line 1000 forms a second angle $\theta_2$ and the micropillar pair 114D is disposed at the vicinity of the second central line 1004. Furthermore, the second pair 114B is a mirror image of the fourth pair 114D with the reference line 1000 as the line of symmetry and the third pair 114C is a mirror image of the first pair 114A along the reference line 1000.

The aforementioned cooling assembly 100 can be applied to cool any heat-generating elements placed on the receiving area of the first plate 104. In a particular embodiment, it is used to dissipate heat from a high power electronic module such as an insulated-gate bipolar transistor (IGBT) module. In one exemplary embodiment of present invention, the IGBT module consumes 10 KW heat power and carries 100A current. It generates a heat flux density of 1,200 W/cm$^2$. Moreover, the product lifetime of the IGBT is more than 10 years. With such demanding requirements, the cooling assembly must be able to dissipate and transfer the heat out efficiently and consistently to ensure the longevity of the product.

In the exemplary embodiment, the IGBT module is disposed on the receiving area of the substrate. The material for the heat spreader, the micropillars, the pin fins and the heat base can be selected from high thermal conductivity materials such as copper, aluminum and steel and Copper Tungsten Alloy. The heat spreader in this embodiment has an inverted truncated pyramid shape. The micropillars of this embodiment are cylindrical shape with both diameter and height between 200 μm to 300 μm. The pin fin in this embodiment is also cylindrical with diameter of 3 mm and height up to 7.5 mm. The device 300 that generates pressurized liquid is a pump and the liquid is water. In another embodiment, it is liquid coolant. The experiment result based on this embodiment is disclosed below.

Experiment Results

The effect of deploying a plurality of micropillars around a heat dissipating fin or pin fin can be readily seen from results shown in FIGS. 5A to 5D. FIG. 5A depicts a cooling assembly without micropillars extending from the heat spreader and FIG. 5C shows the corresponding turbulence intensity profile. The turbulence intensity is a dimensionless coefficient characterizing turbulence and is expressed as a percent. A zero percent means no turbulence in the liquid flow whereas a value of 15% signifies a high-turbulence fluid flow. Likewise, FIG. 5B shows six micropillars surrounding the pin fin and FIG. 5D shows the corresponding turbulence intensity profile. In FIGS. 5C and 5D, the turbulence intensity is represented by a gray scale whereby black color represents zero percent while white denotes 15%. In both cases, liquid flows from the left to the right with mass flow rate of 0.1 kg/s. For the case without micropillars (FIG. 5A) the turbulence intensity increases only slightly as the liquid fluid flows around the pin fin whereas for the case with micropillars as shown in FIG. 5B, the turbulence intensity attends a very high value of 15% at the vicinity where the micropillars are located. This clearly demonstrates that having the micropillars surrounding a pin fin at locations depicted in FIG. 5B greatly promotes the formation of turbulent flow. As turbulence flow facilitates heat exchange, heat can be transferred much more effectively from the heat-dissipating fin and the micropillars to the flowing liquid.

Figure 6A:
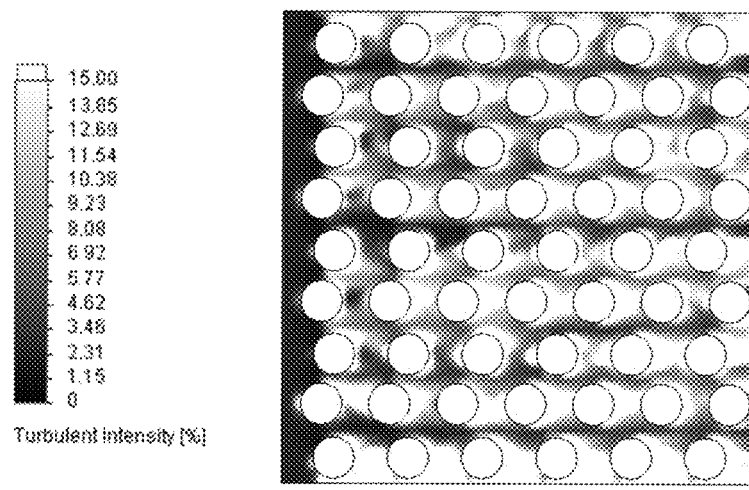
FIG. 6A shows the turbulence intensity distribution around the heat dissipating fins according to one configuration.
Figure 6B:
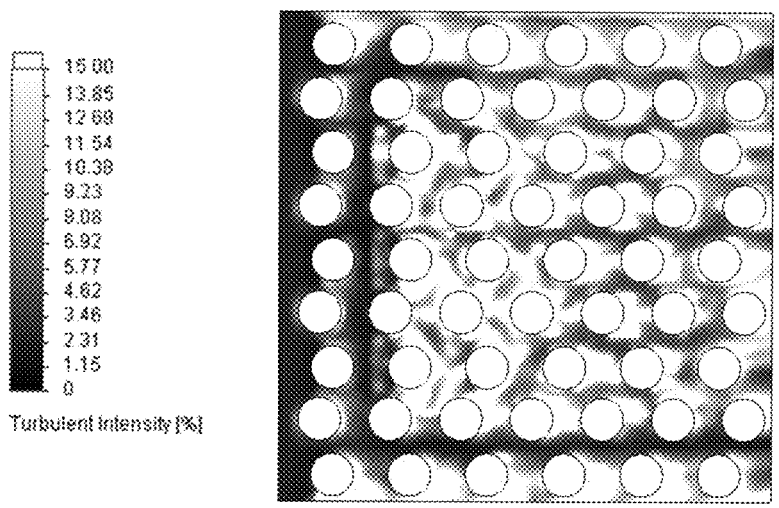
FIG. 6B shows the turbulence intensity distribution around the heat dissipating fins, where a plurality of micropillars are disposed around the heat dissipating fins according to an exemplary embodiment of present invention.

Further experiment results are shown in FIG. 6A and FIG. 6B, where the turbulence intensity profiles of a group of pin fins with and without the surrounding micropillars are compared. FIG. 6A shows turbulence intensity profile where micropillars are absent. FIG. 6B shows turbulence intensity where the micropillars are arranged in a pattern as shown in FIG. 4C. The same gray scale as mentioned in the previous paragraph is used to illustrate the turbulence intensity profile, and again, liquid fluid flows from the left to the right. As witnessed in these figures, turbulence intensity in FIG. 6B is more intense than that in FIG. 6A in many areas of these figures, which shows that the addition of micropillars, arranged in a pattern as disclosed in the present invention creates higher turbulence intensity than just using pin fins alone.

A table that summarizes the simulation results which compare the thermal performance and coolant status under five different configurations is shown in FIG. 7. The first configuration uses only the heat spreader. The second configuration adopts a combination of heat spreader and a plurality of micropillars. A third configuration uses pin-fins only while the forth configuration combines the heat spreader and a plurality of pin-fins. The fifth configuration adopts the combination of heat spreader, plurality of micropillars, and plurality of pin-fins.

Referring to the thermal performance column of the table, the forth configuration (heat spreader+pin-fin) is set as the bench mark solution for comparison and hence its performance is set at 100%. The thermal performance of the first configuration solution is only 29%, which is much less than the bench mark solution. The thermal performance of the second configuration is 36.7% which indicates that adding micropillars to the heat spreader improves the thermal performance; but it is still far below the bench mark solution. The thermal performance of the third configuration is 63.5%, which is also less than the bench mark performance. However, the thermal performance of the fifth configuration, which is a solution disclosed in this invention, achieves 137%, which is much more efficient than the bench mark solution.

The third column of the table further describes the coolant status under different configurations. The liquid coolant is in laminar flow status for the first and the second configuration. It attends the transitional flow status under the third and the fourth configuration. However, the liquid coolant is in fully developed turbulent flow under the configuration of the embodiment of this invention.

The exemplary embodiments of the present invention are thus fully described. Although the description referred to particular embodiments, it will be clear to one skilled in the art that the present invention may be practiced with variation of these specific details. Hence this invention should not be construed as limited to the embodiments set forth herein.

Figure 8A:
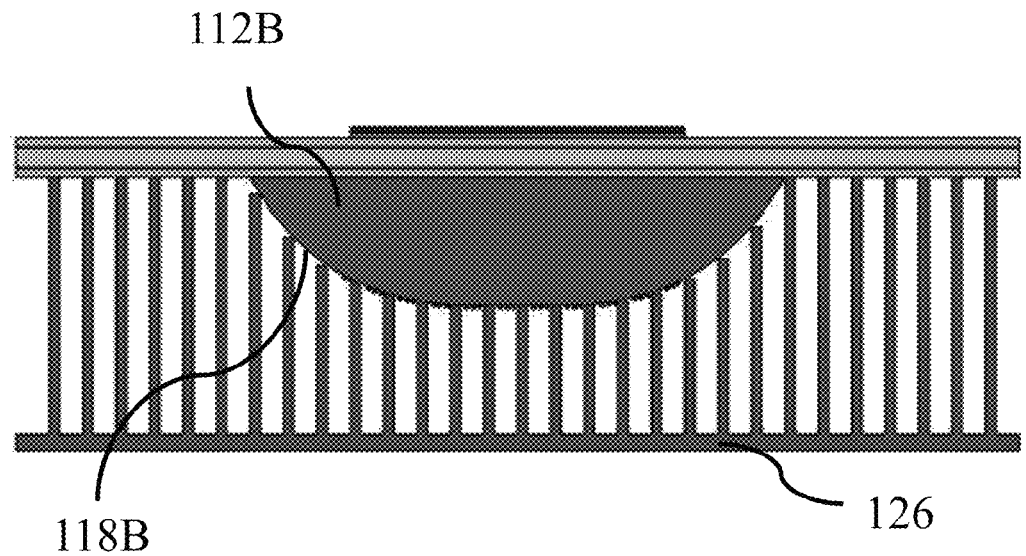
FIG. 8A and FIG. 8B show the side views of two different exemplary embodiments of the present invention.

For example, the shape of the heat spreader can assume different shapes other than the inverted truncated pyramid shape as shown in FIGS. 2 and 3. FIG. 8A shows an arc spreader 112B with a hemi-ellipsoidal shape. The outer arc surface 118B also approximates the isothermal surface well. Similarly, other shapes such as inverted truncated cone shape, semi-oval, and hemisphere shape may also be adopted.

Figure 8B:
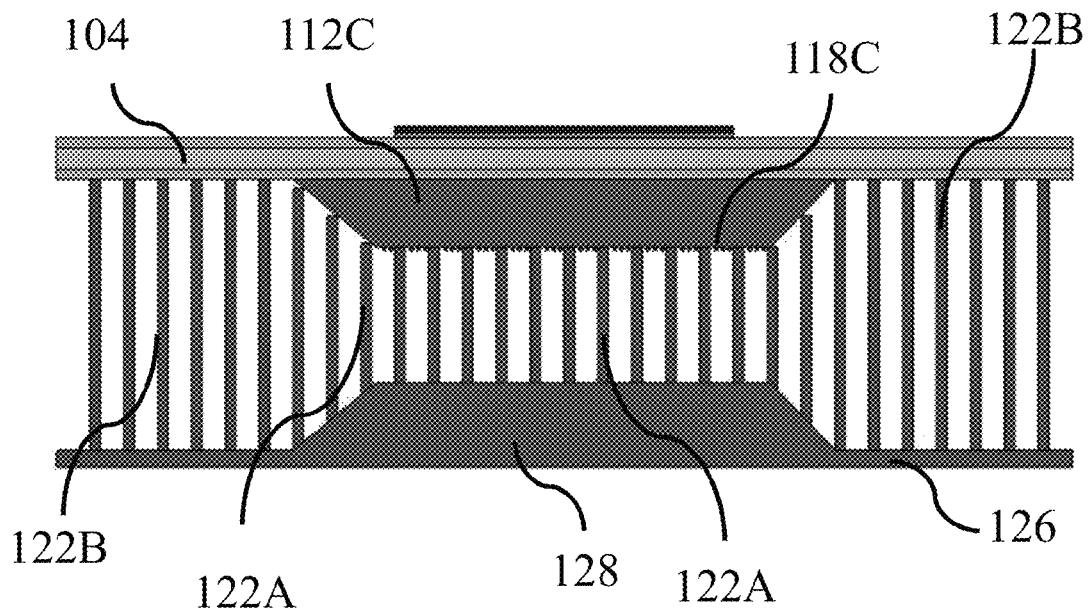

In another embodiment of present invention shown in FIG. 8B, a convex object 128 is extended from the second plate 126 towards the outer surface 118C of the heat spreader 112C as shown in FIG. 8B. This arrangement forms an 'H' shape sub-channel 208 which is even narrower than the original sub-channel without the convex object 128. In one embodiment, the convex object is with a shape similar to heat spreader 112C but in an inverted direction. The first plurality of heat dissipating fins 122A is extended from the convex object 128 to couple with the heat spreader 112C, while the second plurality of heat dissipating fins 122B is extended from the second plate 126 to couple with the first plate 104. However, it should be appreciated that both the heat spreader and the convex object can assume different shapes as mentioned above for achieving the same objective of creating a narrow channel.

Furthermore, it is mentioned that the plurality of micropillars is disposed at the outer surface 118 of the heat spreader 112 in the exemplary embodiment disclosed in previous paragraphs. This is not necessary the only surface in the heat spreader where the micropillars can be placed. In fact, the micropillars could also be disposed at other surfaces of the inverted truncated pyramid. And if the heat spreader takes on other shapes like the hemi-ellipsoidal shape as shown in FIG. 8A, the micropillars can be located not only at the bottom portion of the heat spreader 112B but also extended to the side walls.

While the shape of the micropillars is described as cylindrical in FIG. 4A, FIG. 4B and FIG. 4C above, it is clear that other shapes and sizes may be used according to the user's preference. Other forms, such as oval cylindrical, hexagonal prism may be fabricated. Similarly, the shape of the heat dissipating fin described above can also take on other shapes such as are oval cylindrical, hexagonal prism instead of cylindrical In addition, the receiving area mentioned above may be designed to accommodate more than one electronic module. In fact, in a three-phase power transmission system, three IGBT modules can be placed on the receiving area for a single cooling assembly to cool. The cooling assembly may have one heat spreader and micropillar structure for all the three heat-generating elements, or it may have a separate heat spreader/micropillar structure for each of the three modules. Those skilled in the art, based on the teaching of this disclosure, can assess the specific heat dissipation requirements of their product, and design an appropriate cooling assembly using various ideas discussed in this disclosure on the shapes of the heat spreader, the geometric arrangement between the micropillars and the pin fins, and the dimensions and placements of various components to meet the requirements accordingly.

Lastly, while liquid cooling is mentioned in the aforementioned embodiments, it should be obvious that the inventive ideas disclosed herein also apply to air cooling. In this case, the device 300 can be a fan or an air pump that forces air through the inlet 202. In this case, some of the components like the second pipe 304 and the cooling module 306 may not be necessary.

What is claimed is:

1. A cooling assembly, comprising:
  a receiving area on a first surface of a first plate that receives at least one heat generating element;
  a heat spreader including an inner surface and at least one outer surface; said inner surface affixed to a second surface of said first plate adjacently opposite to said receiving area to conductively dissipate heat generated from said at least one heat generating element;
  a plurality of heat dissipating fins spaced apart from each other; each said heat dissipating fin coupled to a second plate and extending transversely therefrom to couple to said heat spreader, wherein said second plate is positioned opposite to said first plate with a space created therebetween to form a channel for a fluid to flow through; and
  a plurality of micropillars disposed on a bottom surface of said heat spreader,
  wherein an end of the heat dissipating fins contacts the bottom surface of the heat spreader,
  wherein said micropillars are disposed in pairs around the end of the heat dissipating fins at an angle within a range of 70-90 degrees between a reference line and a central line of said pair, said reference line being in parallel with an initial flow direction of said fluid and crossing a center of the end of the heat dissipating fin, said central line crossing the center of the end of the heat dissipating fins and a location in a middle of paired micropillars,
  wherein when said fluid flows through said channel between said first plate and said second plate, said plurality of heat dissipating fins, said heat spreader and said plurality of micropillars in combination create an enhanced turbulent flow upon said fluid so as to effectively dissipate heat from said heat spreader through said fluid.

2. The cooling assembly of claim 1, wherein said at least one outer surface of said heat spreader forms a shape with an isothermal surface; said isothermal surface being formed when heat is dispersed from said at least one heat generating element through said inner surface into interior of said heat spreader.

3. The cooling assembly of claim 2, wherein said heat spreader is a quasi-funnel shape selected from inverted truncated pyramid shape, inverted truncated cone shape, semi-oval shape, hemisphere shape and hemi-ellipsoidal shape.

4. The cooling assembly of claim 1, wherein said plurality of micropillars is disposed in a predefined pattern around each of said plurality of heat dissipating fins.

5. The cooling assembly of claim 4, wherein said predefined pattern is a grid pattern and said plurality of micropillars is disposed at grid points of said grid pattern except on those locations that are occupied by said heat dissipating fins.

6. The cooling assembly according to claim 5, wherein said predefined pattern is an offset grid pattern comprising alternating first grid lines and second grid lines; said second grid lines being a distance offset from said first grid lines wherein said plurality of micropillars is disposed at the grid points of said offset grid pattern except on those locations that are occupied by said heat dissipating fins.

7. The cooling assembly of claim 4, wherein said plurality of micropillars is disposed around but not contacting said heat dissipating fins.

8. The cooling assembly of claim 1, wherein at least a pair of said plurality of micropillars is located at an angle within a range of 130 degrees to 150 degrees between the reference line and a central line of said pair.

9. The cooling assembly of claim 1 further comprising:
  four side plates to form an enclosed chamber together with said first plate and said second plate; one of said side plates including an inlet for said fluid to enter into said chamber; another one of said side plates including an outlet for said fluid to exit said chamber; and
  a device that applies pressure to said fluid, enabling said fluid to flow from said inlet to said outlet.

10. The cooling assembly of claim 1, wherein said micropillars have a cylindrical shape with a diameter between 200 µm to 300 µm and a height between 200 µm to 300 µm.

11. The cooling assembly of claim 1 further comprises a convex shape object extended from said second plate towards said heat spreader with a space therebetween.

12. An electronic apparatus, comprising:
at least one electronic module that includes at least one electronic component that generates heat; and
a cooling assembly, comprising:
  a receiving area on a first surface of a first plate that receives the at least one electronic module;
  a heat spreader including an inner surface and at least one outer surface; said inner surface affixed to a second surface of said first plate adjacently opposite to said receiving area to conductively dissipate heat generated from said at least one electronic module;
  a plurality of heat dissipating fins spaced apart from each other; each said heat dissipating fin coupled to a second plate and extending transversely therefrom to couple to said heat spreader, wherein said second plate is positioned opposite to said first plate with an interior space created therebetween to form a channel for a fluid to flow through; and
  a plurality of micropillars disposed on a bottom surface of said heat spreader,
  wherein an end of the heat dissipating fins contacts the bottom surface of the heat spreader,
  wherein said micropillars are disposed in pairs around the end of the heat dissipating fins at an angle within a range of 70-90 degrees between a reference line and a central line of said pair, said reference line being in parallel with an initial flow direction of said fluid and crossing a center of the end of the heat dissipating fin, said central line crossing the center of the end of the heat dissipating fins and a location in a middle of paired micropillars,
  wherein when said fluid flows through said channel between said first plate and said second plate, said plurality of heat dissipating fins, said heat spreader and said plurality of micropillars in combination create an enhanced turbulent flow upon said fluid so as to effectively dissipate heat from said heat spreader through said fluid.

13. The electronic apparatus of claim 12, wherein said at least one outer surface of said heat spreader forms a shape with an isothermal surface; said isothermal surface being formed when heat is dispersed from said at least one electronic module through said inner surface into the interior space of said heat spreader.

14. The electronic apparatus of claim 12, wherein said plurality of micropillars is disposed in a predefined pattern around each of said plurality of heat dissipating fins.

15. The electronic apparatus of claim 14, wherein said predefined pattern is a grid pattern and said plurality of micropillars is disposed at grid points of said grid pattern except on those locations that are occupied by said heat dissipating fins.

16. The electronic apparatus of claim 15, wherein said predefined pattern is an offset grid pattern comprising alternating first grid lines and second grid lines; said second grid lines being a distance offset from said first grid lines wherein said plurality of micropillars is disposed at the grid points of said offset grid pattern except on those locations that are occupied by said heat dissipating fins.

17. The electronic apparatus of claim 14, wherein said plurality of micropillars is disposed around but not contacting said heat dissipating fin.

18. The electronic apparatus of claim 12, wherein said micropillars have a cylindrical shape with a diameter between 200 μm to 300 μm and a height between 200 μm to 300 μm.

19. A cooling assembly, comprising:
  a first plate having a top surface that receives a heat generating element and a bottom surface;
  a second plate oppositely disposed from the first plate to form a channel between the first plate and the second plate;
  a fluid that enters the channel from an inlet at an initial speed and an initial direction in parallel with the first plate and flows out of the channel through an outlet;
  a heat spreader oppositely disposed from the heat generating element and having an inner surface that contacts the bottom surface of the first plate and an outer surface that faces the second plate;
  a plurality of micropillars on the outer surface of the heat spreader; and
  a plurality of heat dissipating fins extending outwardly from the second plate with an end that contacts the outer surface of the heat spreader and the bottom surface of the first plate,
  wherein the micropillars are disposed in pairs to form paired micropillars around the end of the heat dissipating fins at an angle within a range of 70 degrees to 90 degrees between a reference line and a central line of the pair, the reference line is in parallel with the initial direction of the fluid and crosses a center of the end of the heat dissipating fin, and the central line crosses the center of the end of the heat dissipating fins and a center point between the paired micropillars,
  wherein when the fluid flows through the channel between the first plate and the second plate, the heat dissipating fins, the heat spreader and the micropillars interact with each other to create an enhanced turbulent flow upon the fluid such that the fluid moves at a higher speed at the outer surface of the heat spreader than the initial speed to effectively dissipate heat from the heat generating element to the fluid.

20. The cooling assembly of claim 19, wherein the fluid moves along a plurality of directions underneath the outer surface of the heat spreader that are different than the initial direction at the inlet.

* * * * *